(12) United States Patent
Chaware et al.

(10) Patent No.: US 9,989,572 B1
(45) Date of Patent: Jun. 5, 2018

(54) METHOD AND APPARATUS FOR TESTING INTERPOSER DIES PRIOR TO ASSEMBLY

(71) Applicant: Xilinx, Inc., San Jose, CA (US)

(72) Inventors: Raghunandan Chaware, Sunnyvale, CA (US); Ganesh Hariharan, Santa Clara, CA (US); Amitava Majumdar, San Jose, CA (US)

(73) Assignee: XILINX, INC., San Jose, CA (US)

( * ) Notice: Subject to any disclaimer, the term of this patent is extended or adjusted under 35 U.S.C. 154(b) by 703 days.

(21) Appl. No.: 14/494,400

(22) Filed: Sep. 23, 2014

(51) Int. Cl.
*G01R 31/02* (2006.01)
*G01R 31/28* (2006.01)
*G01R 1/067* (2006.01)

(52) U.S. Cl.
CPC .......... *G01R 31/021* (2013.01); *G01R 1/067* (2013.01); *G01R 31/28* (2013.01)

(58) Field of Classification Search
CPC .......... G01L 1/26; G01L 1/25; G01R 15/185; G01R 3/00
USPC ...... 324/754.03, 500, 750.15, 750.3, 754.11, 324/755.01, 755.07, 755.11, 324/757.02–762.06
See application file for complete search history.

(56) References Cited

U.S. PATENT DOCUMENTS

| 5,800,184 | A | * | 9/1998 | Lopergolo | ........... | H05K 7/1069 |
| | | | | | | 439/591 |
| 6,600,334 | B1 | * | 7/2003 | Hembree | ........... | G01R 31/2886 |
| | | | | | | 324/754.14 |
| 2008/0143379 | A1 | * | 6/2008 | Norman | ........... | H01L 23/50 |
| | | | | | | 326/39 |

OTHER PUBLICATIONS

U.S. Appl. No. 14/242,760, filed Apr. 1, 2014, Hariharan, Ganesh et al., Xilinx, Inc. 2100 Logic Drive San Jose, CA USA.

* cited by examiner

*Primary Examiner* — Melissa Koval
*Assistant Examiner* — Trung Nguyen
(74) *Attorney, Agent, or Firm* — Keith Taboada

(57) ABSTRACT

A method and a probe device for testing an interposer prior to assembly are described herein. The method includes coupling a plurality of probe tips of a probe device to the plurality of signal interconnect paths of the interposer to be tested. A test signal is provided from the probe device to the plurality of signal interconnect paths of the interposer and a quality characteristic of signal interconnect paths of the interposer is detected based on behavior of the interposer in response to the test signal.

16 Claims, 10 Drawing Sheets

METHOD AND APPARATUS FOR TESTING INTERPOSER DIES PRIOR TO ASSEMBLY

FIELD OF THE INVENTION

The disclosure generally relates to a method and apparatus for testing interposer dies prior to assembly.

BACKGROUND

3-D or 2.5-D integrated circuit (IC) devices may include one or more semiconductor dies connected through an interposer die, which is then mounted on a package substrate. The semiconductor dies of the 3-D or 2.5-D IC devices may have different functionalities and may be located on the same plane or stacked on top of each other. Various configurations for 3-D or 2.5-D IC devices may be realized, depending on the package type and application of the 3-D or 2.5-D IC device.

Such interposer dies include signal interconnect paths that allow for the different semiconductor die in a 3-D or 2.5-D IC device to communicate with each other. Interposers are independently fabricated with those paths and semiconductor dies subsequently coupled to those signal interconnect paths through other signal interconnect components (e.g., pads, microbumps) located on/within the surface of the interposer.

Currently, very few mechanisms exist for testing the quality of signal interconnect paths of interposer dies prior to assembly (e.g., coupling semiconductor dies to the interposer die for forming a 3-D or 2.5-D IC device). Prior to packaging of the 3-D or 2.5-D IC device, the signal interconnect paths of the interposer die are only electrically accessible through certain signal interconnect components such as micro-bumps or pads for which conventional probes do not exist. While other mechanisms exist for testing certain quality characteristics of the interposer die, such mechanisms are insufficient.

One such mechanism involves performing an optical scan of the interposer die for identifying defects. Optical scans are capable of detecting large defects in the interposer die, but often overlook smaller defects that may cause open circuits or short circuits in the signal interconnect paths. Such optical scans also suffer from other disadvantages including slow speeds and high costs, thereby rendering them infeasible for testing for quality of signal interconnect paths interposer dies prior to assembly.

Another mechanism for testing the quality of interposer dies prior to assembly involves probing power and ground planes of the interposer. Power and ground planes of the interposer are typically accessible prior to assembly due to their larger sized contacts (e.g., probe-pads), and more isolated location on the interposer die. While probing power and ground planes of the interposer does provide some assurances as to the quality of an interposer prior to assembly, such testing neglects the quality of signal interconnect paths formed in the interposer. Even where power and ground planes are in acceptable condition, defective signal interconnect paths may still produce a non-functional or unreliable 3-D or 2.5-D IC device.

SUMMARY

A method for testing an interposer prior to assembly is disclosed. The method includes identifying a plurality of signal interconnects of the interposer and coupling a plurality of probe tips of a probe device to the plurality of signal interconnects of the interposer. A test signal is provided from the probe device to the plurality of signal interconnects of the interposer and a quality characteristic of signal interconnect paths of the interposer is detected based on behavior of the interposer in response to the test signal.

A probe device for testing an interposer prior to assembly is disclosed. The probe device includes a test die having test circuitry configured to form one or more chain configurations with signal interconnect paths of the interposer and a plurality of probe tips coupled to the test circuitry of the test die. The plurality of probe tips correspond to a plurality of signal interconnects of the interposer and the probe device is configured to provide a test signal to the interposer via the plurality of probe tips and detect a quality characteristic of signal interconnect paths of the interposer based on behavior of the interposer in response to the test signal.

Other features will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIG. 1-2 illustrates a more detailed view of the interposer of the 2.5-D IC device/stacked silicon interconnect technology (SSIT) device in FIG. 1-1.

FIGS. 2-1 and 2-2 are cross-sectional diagrams illustrating some example defects in the interposer.

FIG. 5-1 illustrates a probe device having probe tips coupled directly to the signal interconnect pads of the interposer being tested.

FIG. 5-2 illustrates a probe device having probe tips coupled directly to micro-bumps formed on the signal interconnect pads of the interposer being tested.

DETAILED DESCRIPTION OF THE DRAWINGS

Figure 1:
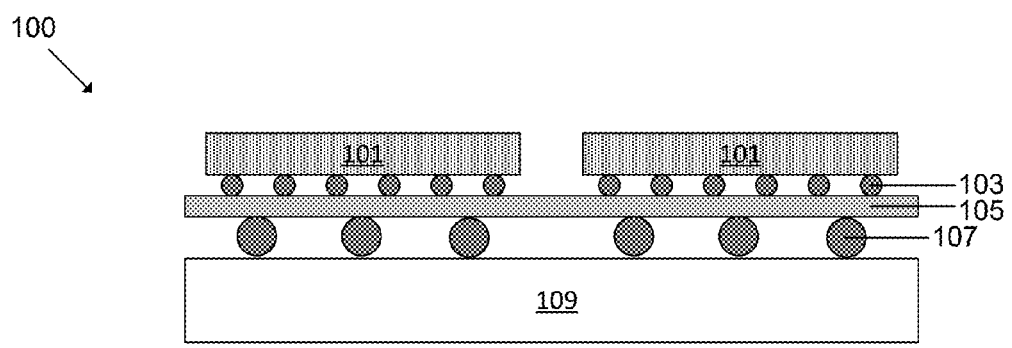
FIG. 1-1 is a cross-sectional diagram illustrating a 2.5-D IC device/stacked silicon interconnect technology (SSIT) device.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

As discussed above, very few mechanisms currently exist for testing for quality characteristics of signal interconnect paths of interposer dies prior to assembling the 3-D or 2.5-D IC device. The mechanisms that do currently exist for testing quality characteristics of signal interconnect paths of interposer dies are insufficient. Assembling 3-D or 2.5-D IC devices without ensuring the quality of signal interconnect paths of the interposer die may lead to a waste of functioning semiconductor die that are packaged with a defective interposer die.

Embodiments described herein provide a method for testing an interposer die prior to assembly. After the interposer die has been formed, signal interconnects (e.g., interconnect pads or micro-bumps) of the interposer die are identified and probe tips of a probe device are coupled to the signal interconnects. As used herein, the terms signal interconnect or signal interconnect component will be used interchangeably to refer to any contact located on or within the interposer die that provides access to the signal interconnect paths formed within the interposer die. A test signal is then provided by the probe device to the signal interconnects of the interposer die through the probe tips and a quality characteristic of signal interconnect paths of the interposer die is detected based on the behavior of the interposer in response to the test signal. The probe tips and the signal interconnects may be coupled in various different configurations to test for different quality characteristics of signal interconnect paths of the interposer die. For example, the probe tips and signal interconnects may be coupled in a daisy chain configuration to test for open circuits in the signal interconnect paths. Alternatively, the probe tips and signal interconnects may be coupled in a multiple chain configuration to test for short circuits/capacitive coupling in the signal interconnect paths. Or, the probe tips and signal interconnects may be configured in any number of multiple or single chain configurations for performance testing of the signal interconnect paths.

By testing the signal interconnect paths of interposer die prior to assembling the 3-D or 2.5-D IC device, defective interposer die may be identified early on and discarded such that quality semiconductor die are not wasted.

FIG. 1-1 is a cross-sectional diagram illustrating a 2.5-D IC device, otherwise referred to herein as a stacked silicon interconnect technology (SSIT) device. The 2.5-D IC device 100 includes semiconductor dies 101, an interposer 105, and a package substrate 109. Semiconductor dies 101 are coupled to the interposer 105 through a set of interconnect components 103, such as microbumps and the interposer 105 is coupled to the package substrate 109 through another set of interconnect components 107, such as C4 bumps.

The semiconductor dies 101 are active dies that may perform various functions depending on the particular application. For example, semiconductor dies 101 may be field programmable gate arrays (FPGAs) or application specific integrated circuits (ASICs).

Figures 1, 2:
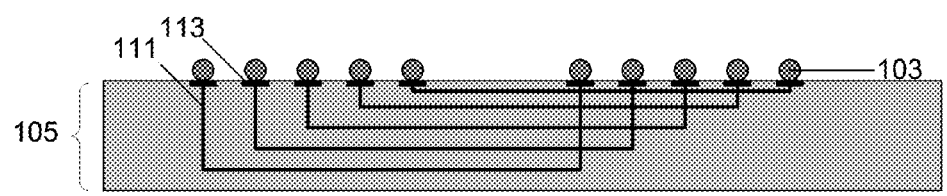
Figures 1, 2:
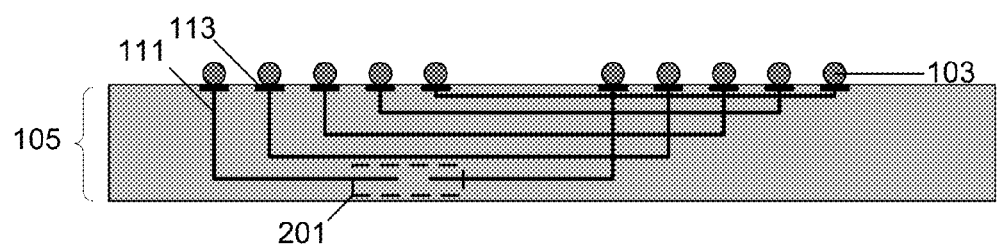
Figure 2:
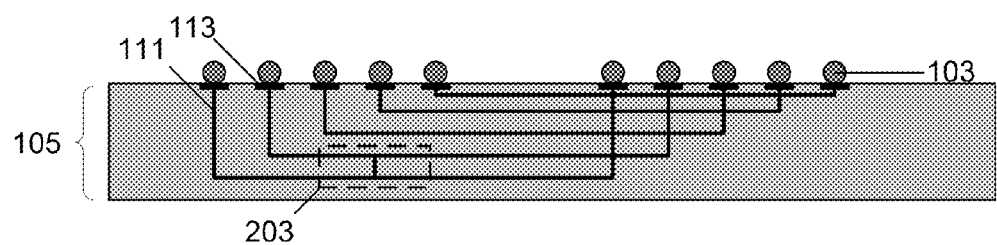

The interposer 105 may be an active die or passive die, and provides signal interconnect paths that allow for the different semiconductor dies 101 in the 2.5-D IC device 100 to communicate with each other. FIG. 1-2 illustrates a more detailed view of the interposer 105, including the signal interconnect paths 111 between microbumps 103 and the formation of microbumps 103 on interconnect pads 113 of the interposer 105. Although not illustrated in FIG. 1-2, the interposer 105 may also provide connection paths between the semiconductor dies 101 and the package substrate 109 through components, such as for example, through-silicon-vias (TSVs).

The package substrate 109 may be utilized to enhance the mechanical stability of the 2.5-D IC device 100 and may also provide power and other I/O to the interposer 105 and/or semiconductor dies 101 of the 2.5-D IC device 100.

During fabrication of the interposer, small defects may arise that cause the interposer to exhibit non-ideal behavior during operation of the 2.5-D IC device 100. For example, where signal interconnect paths in the interposer are not fully formed, open circuits may exist leading to deficient connections being formed between semiconductor dies. As another example, unintentional connections may be formed between adjacent signal interconnect paths or adjacent signal interconnect paths may be formed too close in proximity to each other, leading to short circuits/capacitive coupling during operation of the 2.5-D IC device.

FIGS. 2-1 and 2-2 are cross-sectional diagrams illustrating some example defects in the interposer. FIGS. 2-1 and 2-2 illustrate only a few types of defects that may be identified by the disclosed method and one ordinarily skilled in the art will recognize that various other defects and quality characteristics of signal interconnect paths of the interposer may also be identified by using the disclosed method.

In FIG. 2-1, a signal interconnect path 111 that allows for connections to be made between different semiconductor dies has a missing segment (e.g., open circuit) 201. When an interposer 105 having an open circuit is used in a 2.5-D IC device, interoperability between semiconductor dies will be severely affected, and the semiconductor dies may be rendered ineffective regardless of the quality of the individual semiconductor dies themselves. Techniques such as optical scanning or probing power/ground planes are unable to consistently and accurately detect such defects.

In FIG. 2-2, adjacent signal interconnect paths 111 that allow for connections to be made between different semiconductor dies are unintentionally connected (e.g., short circuited) by a defect 203. When an interposer 105 having a short circuit is used in a 2.5-D IC device, interoperability between semiconductor dies will be severely affected, and the semiconductor dies may be rendered ineffective regardless of the quality of the individual semiconductor dies themselves. Again, techniques such as optical scanning or probing power/ground planes are unable to consistently and accurately detect such defects.

Another defect that goes undetected when conventional techniques are used to test interposers prior to assembly is capacitive coupling. Capacitive coupling occurs when adjacent signal interconnect paths are formed in very close proximity with each other, effectively creating a capacitor between the two paths during operation of the 2.5-D IC device. Once again, techniques such as optical scanning or probing power/ground planes are unable to consistently and accurately detect such defects.

Besides being unable to recognize defects occurring within interposer dies, techniques involving optical scans and probing power/ground planes are also unable to identify any performance characteristics of the interposer that may be critical to the operation of the 2.5-D IC device prior to assembly. For example, the timing characteristics of signal interconnect paths in the interposer may have substantial impact on the operation of the 2.5-D IC device, and being able to identify interposers suffering from poor timing characteristics as bad candidates for 2.5-D IC device assembly may allow for significant cost savings.

Therefore, what is needed is an effective method for testing the signal interconnect paths of interposer die for various quality characteristics prior to assembly.

Figure 3:
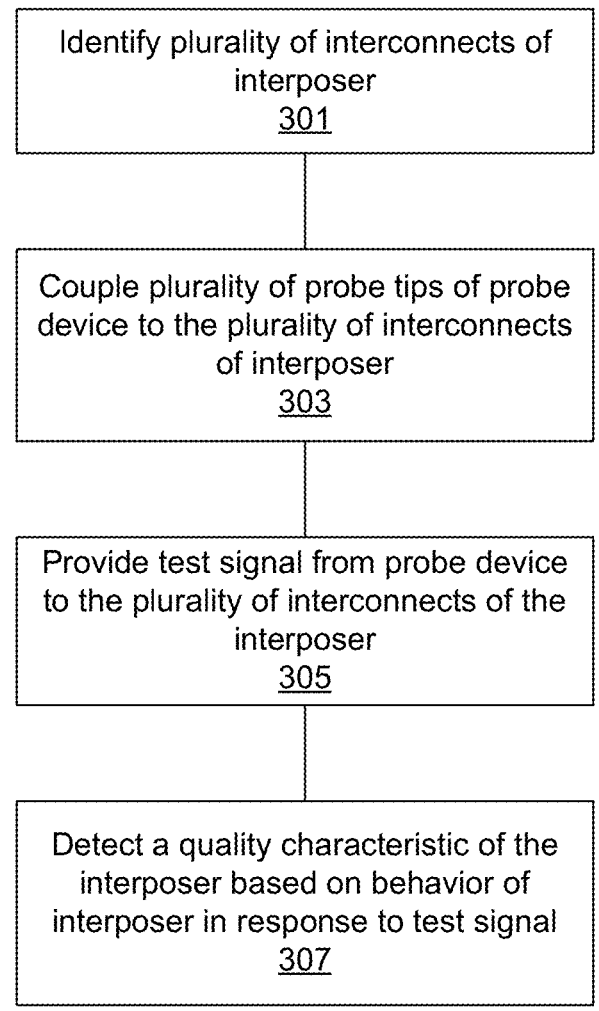
FIG. 3 is a flow diagram illustrating a method for testing an interposer die prior to assembly.

FIG. 3 is a flow diagram illustrating a method for testing an interposer die prior to assembly. It is important to note that interposer die may be tested prior to assembly at both the individual die level as well as at the wafer level.

Initially, a plurality of signal interconnects of an interposer are identified as shown at 301. The signal interconnects of the interposer may be any contact point to the signal interconnect paths of the interposer including interconnect pads formed on or within a surface of the interposer or alternatively micro bumps formed on those interconnect pads.

Once the plurality of signal interconnects of the interposer are identified, a plurality of probe tips of a probe device are coupled to the plurality of signal interconnects of the interposer as shown at 303. The plurality of probe tips may be coupled to the plurality of signal interconnects by making electrical contact with the plurality of signal interconnects. The probe device may include any active or passive test die having test circuitry. The probe tips are formed on a surface of the test die and may be composed of alloy materials, such as for example, Nickel Cobalt, Nickel Phosphorus plated with Gold or Titanium Rhenium. In some embodiments, the probe tips may be 50-80% the size of the signal interconnect pads of the interposer to assist with alignment and to accommodate variations of the interposer.

The probe tips and the signal interconnects may be coupled in a number of different configurations depending on the particular quality characteristic of the signal interconnect paths being measured. For example, the probe tips and the signal interconnects can be coupled to identify open circuits, short circuits/capacitive coupling, and to measure timing characteristics of the signal interconnect paths.

In one embodiment, the probe tips and the signal interconnects may be coupled in a daisy-chain configuration, such that one long conductive path is formed between the probe tips and the signal interconnects. Such a configuration is used to identify any open circuits that may exist in the interposer, which will be described in greater detail below.

In another embodiment, the probe tips and the signal interconnects may be coupled in a multiple chain configuration, wherein adjacent signal interconnect paths of the interposer correspond to different chains. Such a configuration may be utilized to identify any short circuits or capacitive coupling that may exist in the interposer, which will be described in greater detail below.

In another embodiment, the probe tips and the signal interconnects may be coupled in various chained configurations in sync with a clock signal to test for performance characteristics (e.g., timing) associated with those chains.

Once the probe tips are coupled to the signal interconnects of the interposer, a test signal is provided by the probe device to the signal interconnects of the interposer via the plurality of probe tips as shown at 305 and a quality characteristic of signal interconnect paths of the interposer is detected based on behavior of the interposer in response to the test signal and shown at 307.

As used herein, the term quality characteristic refers to any measurable or identifiable feature of the signal interconnect paths of the interposer that may affect functionality of the interposer when assembled in a 3-D or 2.5-D IC device. Additional details regarding the method for identifying the presence of open circuits, short circuits, or capacitive coupling in signal interconnect paths of the interposer will be discussed below with reference to FIGS. 6-9.

Figure 4:
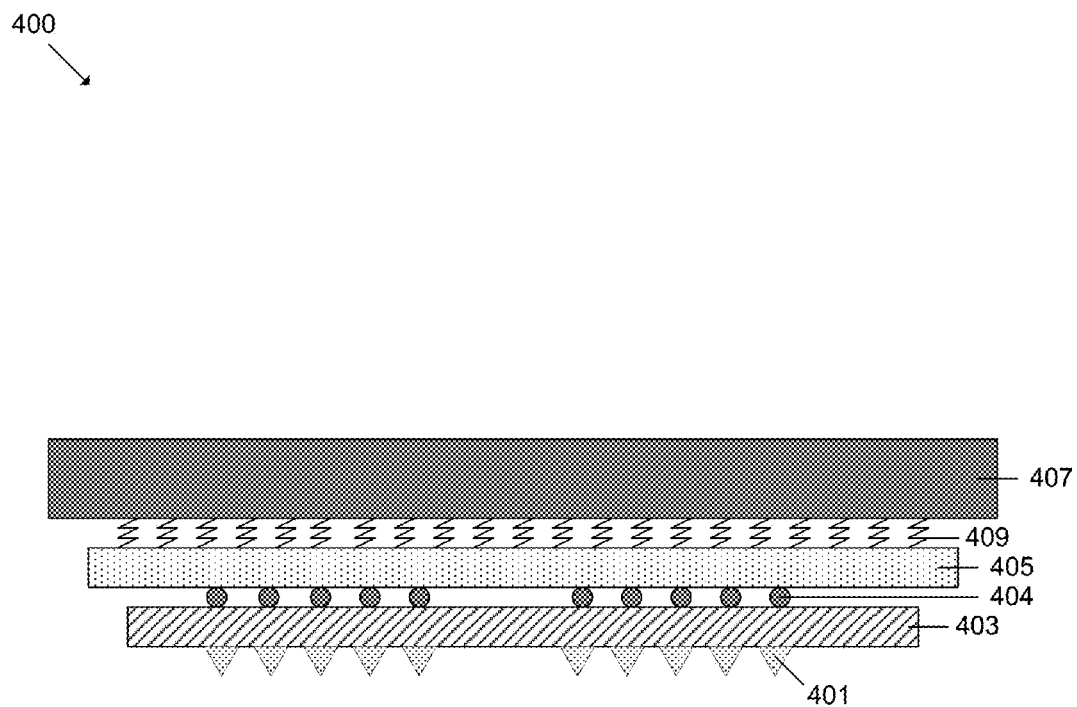
FIG. 4 is a cross-sectional diagram illustrating an example probe device for testing quality characteristics of signal interconnect paths of an interposer die prior to assembly.

FIG. 4 is a cross-sectional diagram illustrating an example probe device for testing quality characteristics of signal interconnect paths of an interposer die prior to assembly.

The probe device 400 depicted in FIG. 4 includes a plurality of probe tips 401 coupled to a test die 403, an interface layer 405 and a package substrate 407.

The probe tips 401 correspond to signal interconnects of an interposer to be tested and may be composed of any number of different materials. For example, the probe tips 401 may be composed of strong alloy materials such as Nickel Cobalt, Nickel Phosphorus plated with Gold, or Titanium Rhenium. The probe tips 401 may have various sizes depending on the particular signal interconnect component of the interposer that the probe tips 401 will be coupled to. The probe tips 401 will be configured to have sizes promote easy alignment with the signal interconnects of the interposer and accommodate any variations in spacing between signal interconnects created by wafer warpage. For example, the probe tips may be 50-80% of the size of the interconnect pads of the interposer.

Figures 1, 5:
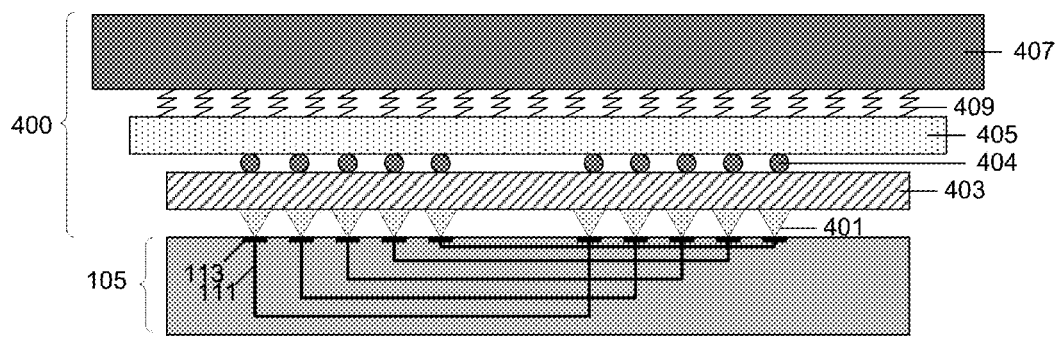
Figures 2, 5:
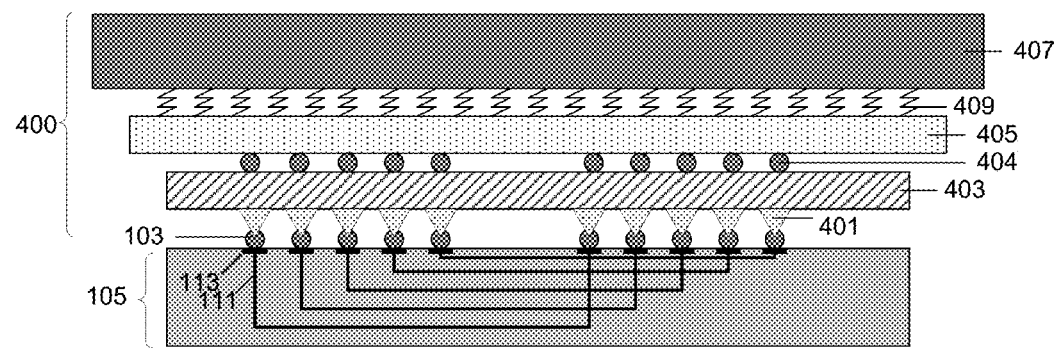

The probe tips 401 are designed to be coupled to various different signal interconnect components of the interposer to be tested. Probe tips 401 may be coupled directly to the interconnect pads of the interposer or directly to the micro bumps (including plated micro bumps) formed on the interconnect pads of the interposer. FIG. 5-1 illustrates a probe device 400 having probe tips 401 coupled directly to the interconnect pads 113 of the interposer 105 being tested. FIG. 5-2 illustrates a probe device 400 having probe tips 401 coupled directly to solder bumps 103 formed on the interconnect pads 113 of the interposer 105 being tested.

The test die 403 may be an active die or a passive die and preferably is one that has already been verified for quality and performance. The probe tips 401 may be coupled to the test die 403 in a manner suitable for the particular quality characteristic being tested in the signal interconnect paths of the interposer. The test die 403 includes test circuitry having a connection configuration that allows for various chain configurations to be made between the test die and the signal interconnect paths of the interposer to be tested.

The test circuitry of the test die 403 may have a connection configuration that allows for a single daisy-chain to be formed between the probe tips 401 and the signal interconnects of the interposer, when the interposer is to be tested for open circuits. The test circuitry of the test die 403 may alternatively have a connection configuration that allows for a multiple chain configuration to be formed between the probe tips 401 and the signal interconnects of the interposer, when the interposer is to be tested for short circuits/capacitive coupling.

The test die 403 may then be coupled to an interface layer 405. The test die 403 may be coupled to the interface layer 405 using solder bumps 404. The interface layer 405 may be composed of any number of materials, including silicon or glass. The interface layer 405 functions to provide mechanical support to the probe device 400 and also acts as an electrical interface to be utilized for providing test signals to the test die 403.

The interface layer 405 may then be coupled to a package substrate 407, such as a printed circuit board (PCB) or probe card. The interface layer 405 may be coupled to the package substrate 407 using springs 409, such that the probe device 400 may be adjusted to compensate for any height variation in the signal interconnects of the interposer to be tested. The package substrate 407 may provide power to the test die 403 and may also act as an interface for allowing a test signal to be provided to the test die 403.

As mentioned above, the probe device 400 is configured to provide a test signal to the signal interconnects of the interposer to be tested via the plurality of probe tips 401. The probe device 400 is also configured to detect a quality characteristic of the signal interconnect paths of the interposer based on the behavior of the interposer in response to the test signal provided. In some embodiments, the test signal may be generated by the probe device 400 itself, and in other embodiments, the test signal may be provided to the probe device 400 by test circuitry external to the probe device.

It is important to note, that the probe device illustrated in FIG. 4 is only an example configuration, and one ordinarily skilled in the art will recognize that various other configurations may also be utilized for testing quality characteristics of signal interconnect paths of the interposer die prior to assembly. For example, in certain embodiments the probe device may be implemented without the interface layer 405 or the package substrate 407.

Figure 6:
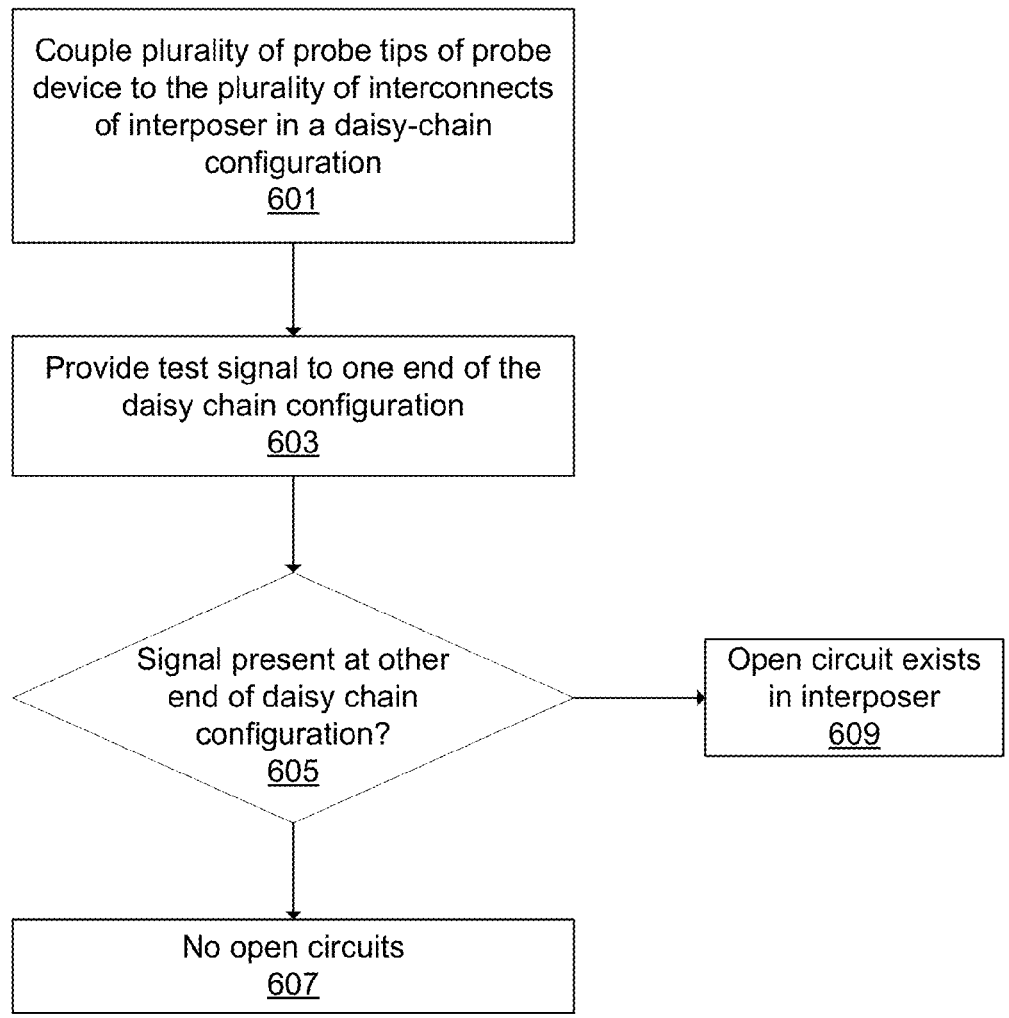
FIG. 6 is a flow diagram illustrating a method for testing for the presence of open circuits in the interposer.

FIG. 6 is a flow diagram illustrating a method for testing for the presence of open circuits in the interposer. Initially, the probe tips of the probe device are coupled to the plurality of signal interconnects of the interposer in a daisy-chain configuration as shown at 601.

Figure 7:
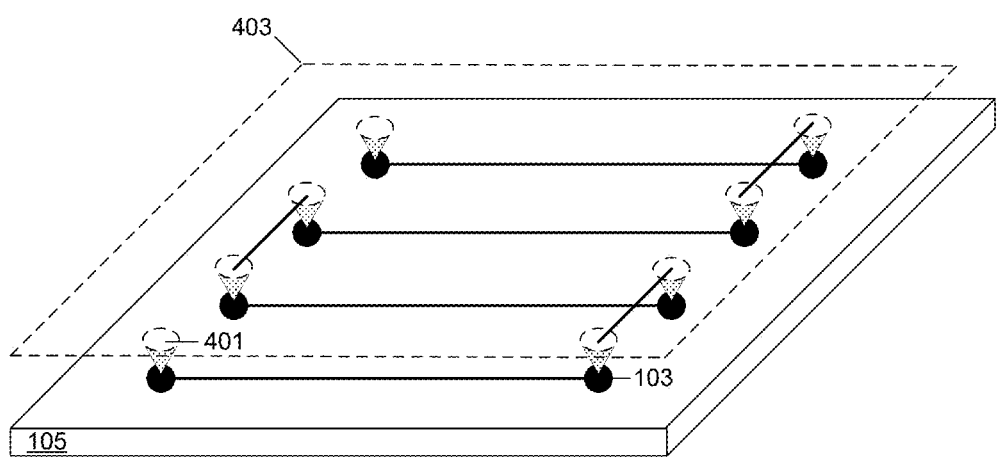
FIG. 7 illustrates a top-view of the daisy-chain configuration formed between probe tips of a probe device and a plurality of signal interconnects of the interposer.

FIG. 7 illustrates a top-view of the daisy-chain configuration formed between the probe tips of the probe device and the plurality of signal interconnects of the interposer. The interposer 105 illustrated in FIG. 7 includes a plurality of signal interconnects (e.g., microbumps) 103 that have a particular connection configuration formed by the signal interconnect paths that are depicted by the solid lines that exist between the signal interconnects 103. The test die 403 of the probe device illustrated in FIG. 7 includes test circuitry that forms a particular connection configuration between probe tips 401 as depicted by the solid lines that exist between the probe tips 401. When the probe tips 401 of the probe device are coupled to the signal interconnects 103 of the interposer 105, a long daisy-chain is formed. The daisy-chain may encompass all of the signal interconnects 103 of the interposer 105, or alternatively may encompass a subset of the signal interconnects 103 of the interposer 105.

Returning back to FIG. 6, a test signal may then be provided to a front end of the daisy chain as shown at 603 and measured at the back end of the daisy chain as shown at 605. Where the interposer is free of any open circuits, the test signal will propagate from the front end of the daisy chain to the back end of the daisy chain and be detectable at the back end as shown at 607. When the interposer does include an open circuit defect, the test signal will fail to propagate from the front end of the daisy chain to the back end of the daisy chain, and will be undetectable at the back end as shown at 609. By coupling the probe tips and the signal interconnects of the interposer in this manner, any open circuits that exist in the signal interconnect paths of the interposer will be detected prior to assembly.

Figure 8:
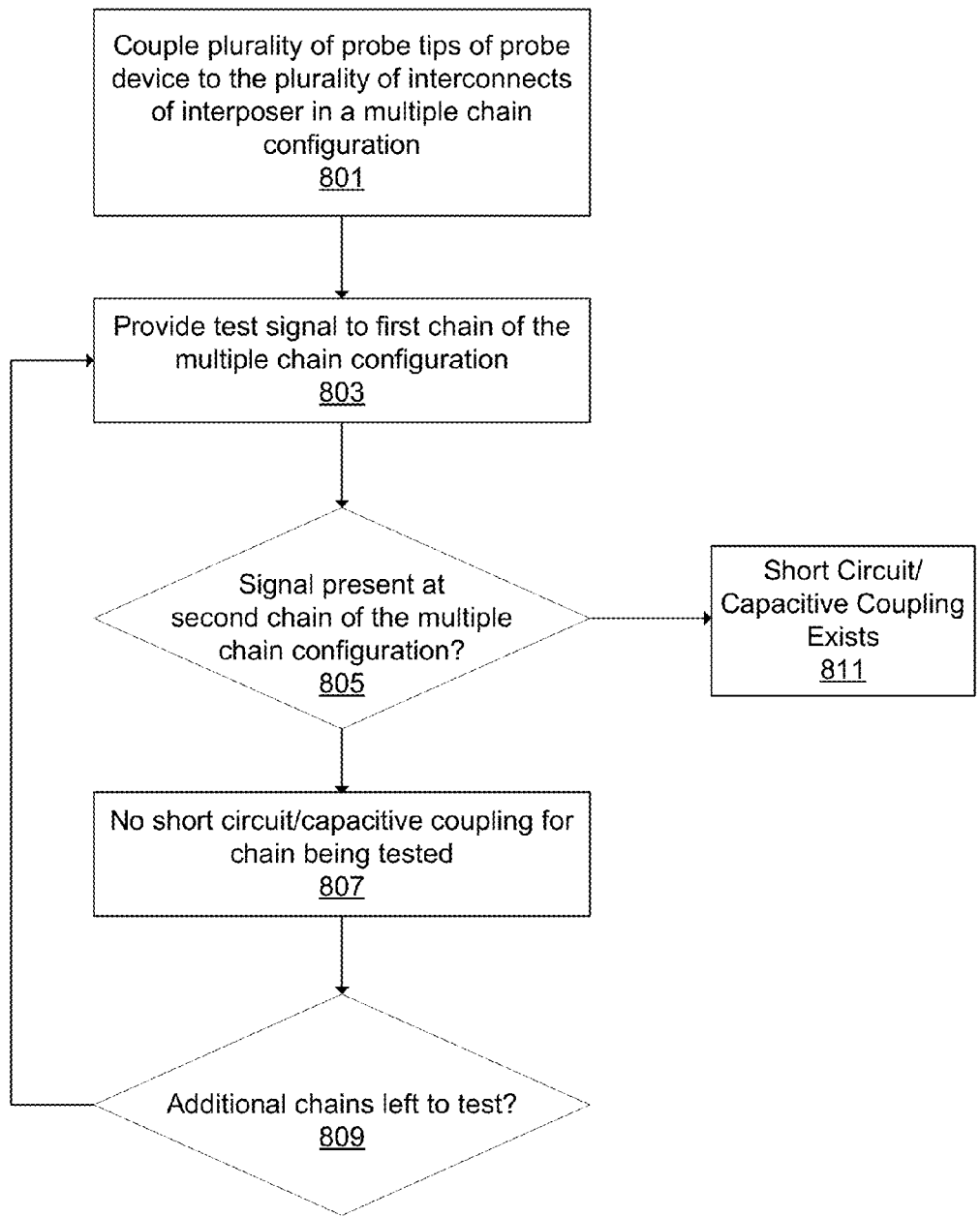
FIG. 8 is a flow diagram illustrating a method for testing for the presence of short circuits or capacitive coupling in the interposer.

FIG. 8 is a flow diagram illustrating a method for testing for the presence of short circuits or capacitive coupling in the interposer. Initially, the probe tips and the signal interconnects of the interposer are coupled in a multiple chain configuration as shown at 801.

Figure 9:
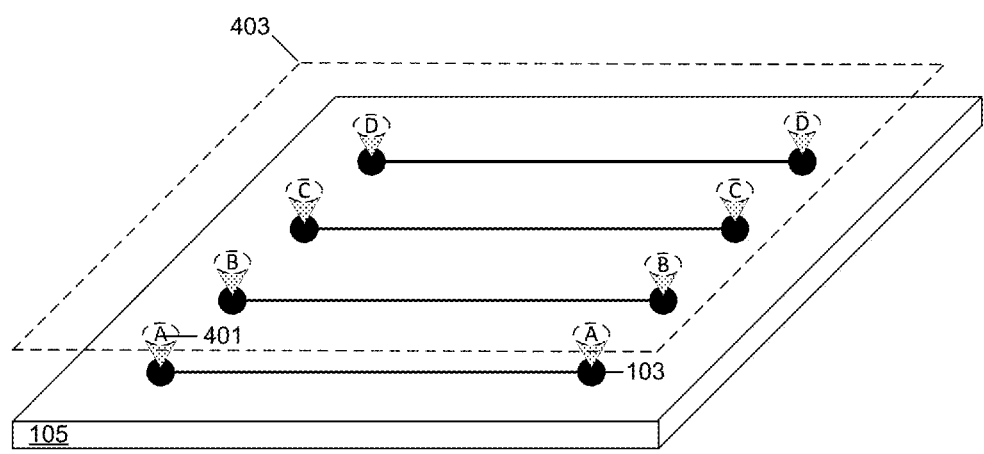
FIG. 9 illustrates a top-view of a multiple chain configuration formed between probe tips of a probe device and a plurality of signal interconnects of an interposer.

FIG. 9 illustrates a top-view of the multiple chain configuration formed between the probe tips of the probe device and the plurality of signal interconnects of the interposer. The interposer 105 illustrated in FIG. 9 includes a plurality of signal interconnects (e.g., microbumps) 103 that have a particular connection configuration that is depicted by the solid lines that exist between the signal interconnects 103. When the probe tips 401 of the probe device are coupled to the signal interconnects 103 of the interposer, a multiple chain configuration is formed. The multiple chain configuration includes a first chain A that corresponds to a first signal interconnect path of the interposer, a second chain B that corresponds to a second signal interconnect path of the interposer that is adjacent to the first signal interconnect path, a third chain C that corresponds to a third signal interconnect path of the interposer that is adjacent to the second signal interconnect path, and a fourth chain D that corresponds to a fourth signal interconnect path of the interposer that is adjacent to the third signal interconnect path. Adjacent signal interconnect paths are not formed on the same chain as a condition for testing for short circuits/capacitive coupling. Various different algorithms may be used to identify the best combination of chains to be used for testing of short circuits/capacitive coupling. For example, an algorithm may be used to minimize the total test time or the number of daisy-chains needed for testing.

Returning back to FIG. 8, a test signal is then provided to a first chain corresponding to a first signal interconnect path of the interposer as shown at 803 and a measurement of the test signal may be taken at a second chain corresponding to an adjacent signal interconnect paths of the interposer as shown at 805. Where the two adjacent signal interconnect paths are free of any short circuits/capacitive coupling, the test signal applied to the first chain will not be detected at the second chain as shown at 807. Where the two adjacent signal interconnect paths include a short circuit defect or are in such close proximity that capacitive coupling occurs, the test signal applied to the first chain will be detected at the second chain as shown at 811. This process may be repeated for any number of adjacent signal interconnect paths of the interposer as shown at 809. For example, chains A and B may be tested first, followed by testing chains B and C and finally chains C and D. By coupling the probe tips and the signal interconnects of the interposer in this manner, any short circuits or capacitive coupling that exist between signal interconnect paths of the interposer will be detected prior to assembly.

Although not depicted in a flow diagram, the probe tips and the signal interconnects of the interposer may also be coupled in any number of chained configurations to test for performance characteristics (e.g., timing) of signal interconnect paths in the interposer. For example, probe tips may be coupled to a front end of a signal interconnect path and a back end of the signal interconnect path. A test signal may then be applied in sync with a clock signal to the front end of the signal interconnect path and detected at the back end of the signal interconnect path to calculate the timing delay of the test signal traversing that signal interconnect path, which will be described in greater detail below. By coupling the probe tips and the signal interconnects of the interposer in this manner, different performance characteristics associated with signal interconnect paths of the interposer may be calculated prior to assembly.

Figure 10:
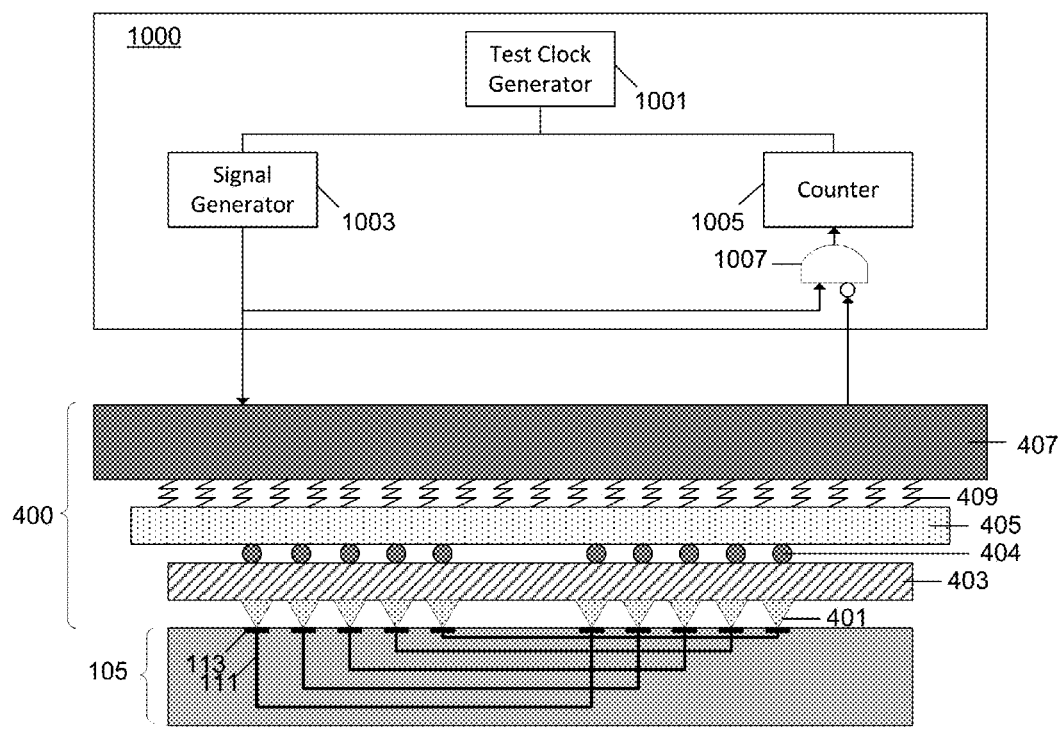
FIG. 10 is a block diagram illustrating an example test circuitry configuration capable of testing for timing of the interposer die.

FIG. 10 is a block diagram illustrating an example test circuitry configuration capable of testing for timing or performance of the interposer die. For purposes of example, and not by way of limitation, the test circuitry depicted in FIG. 10 is utilized to measure timing characteristics for a single signal interconnect path of the interposer at a time.

The test circuitry 1000 illustrated in FIG. 10 includes a test-clock generator 1001, a signal generator 1003, a counter 1005 and an AND gate 1007.

The signal generator 1003 is coupled to the probe tip corresponding to a front end of the signal interconnect path to be measured via the package substrate 407 and interface layer 405, and the counter is coupled to the probe tip corresponding to a back end of the signal interconnect path to be measured also via the package substrate 407 and interface layer 405. An AND gate 1007 is coupled between the probe tip corresponding to the back end of the signal interconnect path to be measured and the counter 1005.

The signal generator 1003 generates a test signal in sync with the tester-clock 1001. The test signal is provided to the front end of the signal interconnect path as well as to an input of the AND gate 1007. The AND gate 1007 is coupled to receive the test signal from the probe tip corresponding to a back end of the signal interconnect path to be measured. When the test signal at the signal generator 10003 and the output of the probe tip corresponding to a back end of the signal interconnect path to be measured are equal, the AND gate 1007 outputs a value to the counter 1005 that causes the counter 1005 to stop.

Thus, the counter begins keeping track of the number of tester-clock cycles at the time the signal generator 1003 provides the test signal to the front end of the signal interconnect path and stops keeping track of the number of tester-clock cycles at the time the counter 1005 receives an output from the AND gate 1007 signaling that the test signal at the back end of the signal interconnect path.

The resolution of timing measurements being made on the signal interconnect paths of the interposer may be controlled by adjusting the frequency of the tester-clock. A tester-clock operating at a higher frequency will yield finer timing measurements, while a tester-clock operating at a lower frequency will yield coarser timing measurements.

It is important to note that the test circuitry depicted in FIG. 10 is only an example configuration, and one ordinarily skilled in the art will recognize that various other configurations may also be utilized for testing measuring timing characteristics of the interposer die prior to assembly. For example, although the test circuitry depicted in FIG. 10 only illustrates the testing of performance characteristics for a single signal interconnect path at a time, the test circuitry may be extended to test performance characteristics of multiple signal interconnect paths simultaneously.

Additionally, although the test circuitry is depicted as being implemented in a test component external to the probe device in FIG. 10, the test circuitry may be implemented within the probe device itself. For example, the test circuitry utilized for performance testing may be implemented within the test die, interface layer or package substrate of the probe device Thus, what has been described is a method and apparatus that may be utilized for testing certain quality characteristics of signal interconnect paths of the interposer prior to assembly.

While the testing of different quality characteristics has been described with reference to performing individual tests for open-circuits, short-circuits/capacitive coupling, and performance, it is important to note such individual tests may be combined and performed as a single test. For example, testing for timing and open circuits may be merged into a single test, where a test for timing is performed and the presence of an open circuit is derived from the timing characteristic identified for the signal interconnect path (e.g., if test signal traverses signal interconnect path in a finite amount of time, then no open circuits exist in that signal interconnect path).

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

What is claimed is:

1. A method for testing an interposer prior to assembly, comprising:
    coupling a plurality of probe tips of a probe device to a plurality of signal interconnect paths residing in the interposer to be tested;
    providing a test signal from the probe device to the plurality of signal interconnect paths of the interposer; and
    detecting a quality characteristic of the signal interconnect paths of the interposer based on behavior of the interposer in response to the test signal, wherein the test signal is provided to the probe device in sync with a tester-clock signal and a timing characteristic of the interposer is detected by evaluating the behavior of the interposer in reference to the tester-clock signal.

2. The method of claim 1, wherein the plurality of the probe tips and the plurality of signal interconnect paths are coupled in a daisy-chain configuration.

3. The method of claim 2, wherein an open circuit is detected for the interposer when the test signal is provided at one end of the daisy-chain configuration and fails to be detected at another end of the daisy-chain configuration.

4. The method of claim 1, wherein the plurality of probe tips and the plurality of signal interconnect paths are coupled in a multiple chain configuration and wherein adjacent interconnect paths in the interposer correspond to different chains.

5. The method of claim 4, wherein a short circuit or capacitive coupling is detected in the interposer when the test signal is provided to one of the multiple chains and is detected at a different one of the multiple chains.

6. The method of claim 1, wherein the plurality of probe tips are coupled directly to interconnect pads of the interposer.

7. The method of claim 1, wherein the plurality of probe tips are coupled directly to interconnect bumps formed on the interposer.

8. The method of claim 1, wherein the interposer is tested at a wafer level.

9. The method of claim 1, wherein the interposer is tested at a die level.

10. A probe device for testing an interposer prior to assembly, comprising:
    a test die having test circuitry configured to form one or more chain configurations with signal interconnect paths residing in the interposer to be tested, wherein the test die is an active die, wherein the test die further comprises:
a clock; and
a counter coupled to the clock; and
a plurality of probe tips coupled to the test circuitry of the test die, wherein the plurality of probe tips correspond to a plurality of interconnect pads of the interposer to be tested;
wherein the probe device is configured to provide a test signal to interconnect pads of the interposer via the plurality of probe tips and detect a quality characteristic of signal interconnect paths of the interposer based on behavior of the interposer in response to the test signal, and wherein the counter tracks a number of tester-clock cycles that pass between when the test signal is provided by the probe device to a front end of a first signal interconnect path of the plurality of signal interconnect paths and the test signal is detected at a back end of the first signal interconnect path.

11. The probe device of claim 10, wherein the test circuitry of the test die has a connection configuration such that a daisy chain is formed when the plurality of probe tips are coupled to the plurality of signal interconnect paths of the interposer.

12. The probe device of claim 10, wherein the test circuitry of the test die has a connection configuration such that multiple chains are formed when the plurality of probe tips are coupled to the plurality of signal interconnect paths of the interposer and wherein adjacent paths in the interposer correspond to different chains.

13. The probe device of claim 10, wherein the probe tips are composed of nickel cobalt, nickel phosphorous plated with gold, or titanium rhenium.

14. The probe device of claim 10, wherein the plurality of probe tips correspond to interconnect pads of the interposer and the plurality of probe tips have a size between 50-80% of the interconnect pads.

15. The probe device of claim 10, wherein the plurality of probe tips correspond to interconnect bumps formed on the interposer.

16. The probe device of claim 10, further comprising:
an interface layer coupled to the test die; and
a package substrate coupled to the interface layer.

* * * * *